United States Patent [19]

Schierz

[11] 4,106,052
[45] Aug. 8, 1978

[54] SEMICONDUCTOR RECTIFIER UNIT HAVING A BASE PLATE WITH MEANS FOR MAINTAINING INSULATING WAFERS IN A DESIRED POSITION

[75] Inventor: Winfried Schierz, Roth, Fed. Rep. of Germany

[73] Assignee: Semikron Gesellschaft fur Gleichrichterbau und Elektronik m.b.H., Nuremberg, Fed. Rep. of Germany

[21] Appl. No.: 829,911

[22] Filed: Sep. 1, 1977

Related U.S. Application Data

[63] Continuation-in-part of Ser. No. 677,851, Apr. 16, 1976, Pat. No. 4,047,197.

[30] Foreign Application Priority Data

Apr. 19, 1975 [DE] Fed. Rep. of Germany ....... 7512573

[51] Int. Cl.² .................. H01L 23/28; H01L 23/02; H01L 23/12
[52] U.S. Cl. ........................ 357/72; 357/74; 357/75; 357/80; 357/81
[58] Field of Search .............. 357/72, 74, 75, 80, 357/81

[56] References Cited

U.S. PATENT DOCUMENTS

| | | | |
|---|---|---|---|
| 3,659,164 | 4/1972 | Gaylor | 357/72 |
| 3,742,599 | 7/1973 | Desmond et al. | 357/72 |
| 3,743,896 | 7/1973 | Weiske et al. | 357/72 |
| 3,783,347 | 1/1974 | Vladik | 357/72 |
| 3,820,153 | 6/1974 | Quinn | 357/72 |
| 3,831,067 | 8/1974 | Wislocky et al. | 357/72 |
| 3,839,660 | 10/1974 | Stryker | 357/72 |
| 3,864,727 | 2/1975 | Schoberl | 357/72 |
| 3,918,084 | 11/1975 | Schierz | 357/82 |
| 4,047,197 | 9/1977 | Schierz | 357/81 |

Primary Examiner—Andrew J. James
Attorney, Agent, or Firm—Spencer & Kaye

[57] ABSTRACT

An improved semiconductor rectifier unit of the type in which two semiconductor rectifier devices are electrically insulated and thermally conductively arranged in an electrical series connection so that a current conducting lead associated with the input and a current conducting lead associated with the output of the series connection as well as a third current conducting lead associated with the connecting conductor between the semiconductor devices are arranged in a row and each one of the two outer current conducting leads together with its associated semiconductor device are firmly mounted on a respective common contact plate which is fastened on the base plate via a wafer of electrically insulating thermally conductive material and in which the semiconductor devices have their contacting and connecting members accommodated in a housing including the base plate and a hollow plastic member fastened to the base plate. The base plate is trough-shaped, has a planar outer bottom surface, has a laterally extending flange on the side walls thereof, and is formed of a material which permits a permanently firm connection with components made of copper used to produce the unit as well as with components made of aluminum used to cool the unit. Means are provided on the bottom inner surface of the base plate for maintaining the wafer of insulating material in a desired position on the base plate during production of the unit. The edge portion of the plastic housing member which is adjacent the base plate is provided with a shaped region which matingly engages the flange to firmly connect the plastic housing member to the base plate.

14 Claims, 4 Drawing Figures

SEMICONDUCTOR RECTIFIER UNIT HAVING A BASE PLATE WITH MEANS FOR MAINTAINING INSULATING WAFERS IN A DESIRED POSITION

CROSS-REFERENCE TO RELATED APPLICATION

This application is a continuation-in-part application of applicant's copending U.S. patent application Ser. No. 677,851, filed Apr. 16, 1976.

BACKGROUND OF THE INVENTION

The present invention relates to a semiconductor unit of the type wherein two semiconductor rectifier devices are electrically insulated and thermally conductively arranged in an electrical series circuit so that a current conducting lead associated with the input, a current conducting lead associated with the output of the series circuit as well as a third current conducting lead associated with the connecting conductor between the two semiconductor devices are arranged in a row and each one of the two outer current conducting leads, together with its respective associated semiconductor device, is firmly mounted to a respective contacting plate which is fastened on a base plate via a wafer of electrically insulating, thermally conductive material, and wherein the semiconductor devices have their contacting and connecting members accommodated in a housing including the base plate and a hollow plastic member fastened to the base plate.

Such semiconductor units are known from the above-identified copending U.S. patent application, Ser. No. 677,851, the subject matter of which is incorporated herein by reference. The semiconductor units have a compact structure and advantageously permit the arrangement of several such units in a desired electrical interconnection. However, these semiconductor units do have some drawbacks. For example, the mounting of the disc or wafer of insulating material and of the associated contact plates which are provided with semiconductor chips require undesirable expenditures for fastening by means of a soldering process. Additionally, the metal base plate, which is intended to firmly rest on the surface of a cooling component, is not planar to the desired degree because unavoidable mechanical stresses occur already during the manufacture of the semiconductor units, which stresses are the result of juxtaposed materials having different coefficients of thermal expansion. This impedes the transfer of heat to the cooling component.

Finally, due to the curvature of the base plate, which serves as part of the housing, the connection of the plate with the upper or hollow plastic portion of the housing by means of an adhesive resulted in adhesive layers of different thicknesses. Consequently, when the housing is filled with an insulating mass which surrounds and embeds the components, and the insulating mass hardens, undesirable stresses appear at the line of attachment between the base plate and the plastic housing member which stresses result in further bulging of the base plate.

SUMMARY OF THE INVENTION

It is the object of the present invention to provide a semiconductor unit of the above-mentioned type whose components permit a more economical assembly than the prior art arrangements, and whose housing parts can be perfectly connected together while the heat loss is properly dissipated to a cooling component.

This problem is solved by an improvement in a semiconductor rectifier unit of the type comprising: a metal base plate; a pair of spaced electrical contact plates each fastened to a surface of the base plate via a wafer of electrically insulating, thermally conductive material; a pair of semiconductor rectifier devices, each having at least one pn junction and a connecting contact on each of its two opposite major surfaces with each of the semiconductor devices being mounted on and having one of its connecting contacts electrically connected to a respective one of the electrical contact plates; conductive means for electrically connecting one connecting contact of one of the semiconductor rectifier devices to one connecting contact of the other semiconductor rectifier device to connect the semiconductor devices in a series circuit; first, second and third current conducting terminals connected to the input of the series circuit, to the output of the series circuit, and to the conductive means, respectively, the first, second and third current conducting terminals being arranged in a row with each of the two outer current conducting terminals of the row being electrically conductively connected to a respective one of the electrical contact plates; and a housing for the series circuit, including its connecting parts, formed by a hollow plastic member and the base plate. According to the invention the base plate is trough-shaped, has a planar bottom outer surface, has a laterally extending flange on the side walls thereof, and is formed of a material which permits a permanently firm connection with components made of copper used to produce the series circuit as well as with components made of aluminum used to cool the unit; means are provided on the bottom inner surface of the base plate, on which the series circuit is mounted, for maintaining the wafer of insulating material in a desired position on said base plate during production of said unit; and the edge portion of the plastic housing member which is adjacent the base plate is provided with a shaped region which matingly engages with the flange to firmly connect the plastic housing member to the base plate.

BRIEF DESCRIPTION OF THE DRAWINGS

The same parts bear the same reference numerals in all figures.

DETAILED DESCRIPTION OF THE PREFERRED EMBODIMENTS

Figure 1:
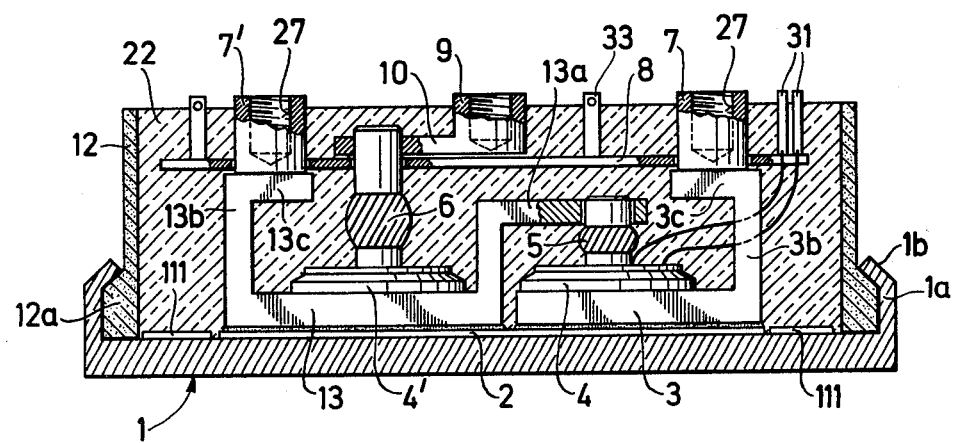
FIG. 1 is a sectional view of a semiconductor unit according to the invention.

Referring now to FIG. 1, the improved semiconductor rectifier unit according to the invention includes a generally rectangular base plate 1 having a planar bottom outer surface and upwardly extending side walls 1a so that the base plate is trough-shaped. The base plate 1 is made of a metal which is particularly suitable to conduct heat, for example, copper or aluminum, or of a combination of these metals or of an alloy of these metals. Securely mounted on the inner bottom surface of base plate 1 via a layer or wafer 2 of electrically insulating thermally conducting material, for example, of oxide ceramic, are a pair of contacting members or plates 3 and 13 which are spaced from one another and which each accommodate a respective semiconductor device 4 or 4'. The wafer or layer 2, which has a larger areal expanse in all dimensions than the contact plates 3 and 13, may be common to both contact plates or a separate such layer or wafer 2 may be provided for each contact plate.

During assembly or production of the illustrated unit, the base plate 1, the wafer 2 and the contact plates 3 and 13 are stacked in the illustrated sequence and are firmly connected together by soldering. For this purpose these components, and at least the wafer 2, are each provided with a solderable metallic coating or metallization on their contacting surfaces. In order to economically arrange and maintain the oxide ceramic wafer 2 in a fixed position on a predetermined surface section of the inner bottom face of the base plate 1, particularly during the production stage, the inner bottom face is provided with a plurality of raised portions 111 which extend along a peripheral surface line determined by the areal expanse of the wafer 2 and between which the wafer 2 is inserted.

The side wall 1a of base plate 1 is provided with a laterally extending flange 1b at its upper edge for firmly attaching the base plate 1 to the associated edge region of a housing member 12 of insulating material. The flange 1b may be sloped, for example, as shown, or have some other shape. Preferably as shown, the housing member 12, which is a hollow body that has no bottom or cover plate, is adapted in its maximum expanse to the inner dimensions of the inner bottom surface of base plate 1 so that, during assembly, the member 12 can be inserted and held by the flange 1b of the side wall 1a. The lower edge region 12a of housing portion 12 is preferably reinforced or designed, for example, as a flange-shaped protrusion in order to assure mechanical stability and mating engagement during the establishment of the connection by means of the flange 1b with the base plate 1.

The raised portions 111 on the inner bottom surface of the base plate may extend in such a manner that they simultaneously, together with the side wall 1a of the base plate, serve to hold housing portion 12 and thus contribute to the firm arrangement of the latter during connection with the base plate 1.

As shown in FIG. 1, each of the contact members or plates 3 and 13 may be comprised of a disc-shaped section which is placed on the oxide ceramic wafer 2 and on whose upper surface the semiconductor devices 4 and 4' can be placed, a section 3b or 13b, respectively, which is at an angle to the disc-shaped section, for example perpendicular to the plane of the base plate 1, adjacent a respective end of the device, and a subsequent further section 3c or 13c, respectively, which extends toward the center of the device at an angle to the sections 3b or 13b, respectively, and serves as a platform for a conductive bolt 7 or 7', respectively. Both contacting members 3, 13 have a J-shaped cross section in their above-described sections. Sections 3b, 13b and 3c, 13c each serve as current conductors for connecting the contact electrode of the semiconductor devices 4 and 4', respectively, which face the base plate 1 to the conductive bolts 7 and 7', respectively, which are provided as the current connecting members or terminals for the semiconductor unit.

The electrical series connection of the two semiconductor rectifier devices 4 and 4' is established in that contact plate 13 for the semiconductor device 4' is firmly connected with the upper current conductor 5 of the semiconductor device 4' by means of a bar-shaped protrusion 13a which is angled in the form of steps and faces the semiconductor device 4.

Conductive bolts 7 and 7' are each provided with a threaded bore 27 in order to attach external current conducting members by means of a screw connection. As shown, sections 3c, 13c of the contact members 3 and 13 lie in a plane which is parallel to the plane of the base plate 1 and each forms a supporting surface for a common plate 8 of insulating material which is provided with openings for the bolts 7 and 7'. This plate 8 is provided additionally with soldering or plug-in members 31, 33 which serve to connect the connecting lines of external switching and control devices with the semiconductor devices 4 and 4' which may be controlled rectifiers as indicated for example, for the device 4. The position of the members 31 and 33 is determined by the position of the semiconductor devices within the unit and the members 31 and 33 correspondingly protrude from the finished unit.

Finally, conductive bolt or terminal 9 is also fastened on plate 8 and is connected by means of a conductive contacting bar 10 to the upper current conductor 6 of the semiconductor device 4'. The three conductive bolts or terminals 9, 7 and 7' are arranged in a row, and as shown are connected to the input and the output of the series circuit connection of the two semiconductor devices 4 and 4' and to the connection between the two series connected devices.

Although the specifically illustrated shapes of the various contact and connecting members of the unit are preferred, it is to be understood that these members may have any desired shape and arrangement since their specific configuration and arrangement are not part of the present invention.

The described structure is arranged in the housing, including the housing member 12 and base plate 1, which is open at the top and is embedded in a cast mass of insulating material 22 to such an extent that only the members for connecting the unit to external circuitry, i.e., the terminals 7, 7', 9, 31 and 33 of the unit protrude from the mass 22.

Figure 2:
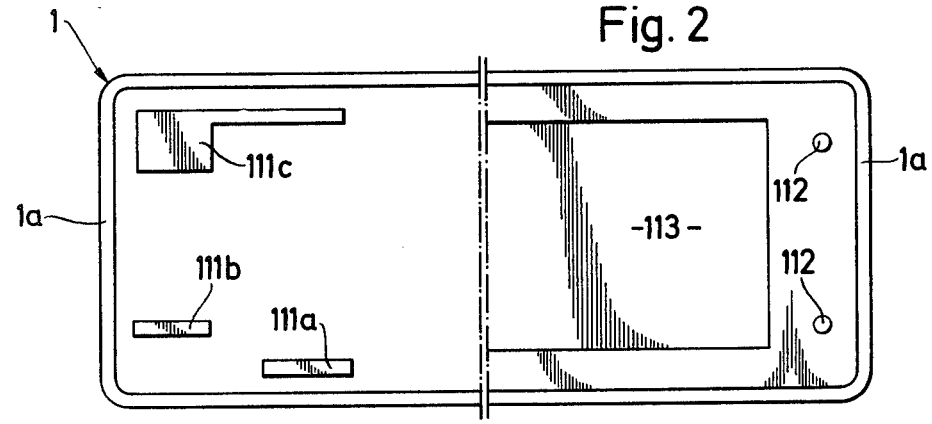
FIG. 2 is a schematic top view of the base plate of the unit according to the invention showing various modifications of same for maintaining the insulating wafer in a defined position on the base plate.

Turning now to FIG. 2, the base plate 1 according to the invention is shown in a top view onto the inner bottom surface. As shown in the left-hand portion of this figure, the inner bottom surface of the base plate 1 may be provided with strip-shaped raised portions 111 which are each arranged parallel to the longitudinal axis of the base plate. Raised portions 111a may be provided at the longitudinal sides and raised portions 111b at the narrow sides of the base plate 1. These raised portions serve to prevent lateral movement of the oxide ceramic wafer 2 when it is soldered to base plate 1. At the longitudinal sides of base plate 1, the raised portions 111a should have the least possible width; the width of raised portions 111b not being critical. The height of raised portions 111 should be equal to or less than the thickness of the ceramic wafer 2. In order to assure sufficient breakthrough resistance between the base plate 1 and the contacting members or plates 3 at different potentials across the base plate 1 and said contacting members or plates 3, 13, the oxide ceramic wafer 2 has a larger areal expanse and protrudes beyond all sides of contacting members or plates 3, 13. The length of all raised portions 111 is not critical. The two raised portions 111a and 111b may also be combined into a single raised portion 111c, as this is also shown in FIG. 2 at a position corresponding to the corner of the wafer 2.

Instead of the strip-shaped raised portions 111, pin or hump shaped raised extensions 112 may be provided (as shown in the right-hand portion of FIG. 2) against which the oxide ceramic wafer 2 and housing portion 12 are supported during insertion.

According to a further modification, the inner bottom surface of the base plate 1 may be provided with a recessed surface section 113 intended for the accommodation of the oxide ceramic wafer 2. The thus resulting reduction in the thickness of base plate 1 produces an additional improvement in the transfer of heat between contacting members 3 and 13 and a cooling member contacting the outer planar bottom surface of the base plate 1.

The base plate 1 can be produced, for example, by cold flow pressing of copper and aluminum such that the portions adjacent the inner bottom surface is made of copper, so that advantageous connection to the oxide ceramic wafer 2 is made possible, and such that the portion adjacent the outer bottom surface is made of aluminum which permits advantageous connection with an adjacent cooling element of aluminum. The thickness of the copper layer portion is always greater than the depth of recess 113 to accommodate the oxide ceramic wafer 2, and the aluminum layer portion is made of a minimum thickness which is determined only by requirements for mechanical stability of the base plate 1.

The base plate may also be made of a known aluminum-magnesium alloy in which case the inner bottom surface is then provided with a coating of nickel so as to enable a solder connection with the oxide ceramic wafer 2.

Figure 3:
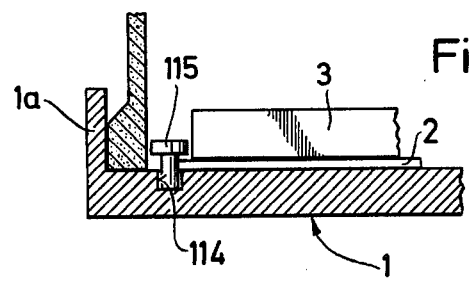
FIG. 3 is a partial sectional view showing a further arrangement according to the invention for maintaining the insulating wafer and the contacting plate in a defined position on the base plate.

FIG. 3 is a sectional view of a further embodiment of the present invention. Instead of providing raised portions or a recess in the base plate 1 a plurality of bores 114, either through bores or in the form of recesses, are provided in the base plate 1 at positions which correspond to the periphery of the ceramic wafer 2 in its desired position on the inner surface of base plate 1. These bores 114 serve to accommodate bolt-shaped limiter members 115 of an elastic synthetic material which are inserted in the bores 114 in a force fit. The limiter members 115 are dimensioned so that their first protruding length section, which approximately corresponds to the thickness of the oxide ceramic wafer 2, holds the wafer 2 against lateral movement, and a subsequent length section having a larger cross section (corresponding to the head of the bolt-shaped member) which in part extends over the upper surface of the wafer 2 to align and maintain the contacting member or plate 3, which follows in the stack during production, in its desired position on the wafer 2. The limiter members 115 are formed of a material which is stable at the soft solder temperatures employed and is otherwise of such elasticity that changes in shape occurring during stacking of the components do no damage. Limiter members 115 may also remain in the structure once the solder connections are made. The limiter members 115 for example may consist of polytetrafluorethylene or polyfluorethylene propylene which are stable in a soft soldering temperature range shorttimely to 250° C.

By designing base plate 1 and the structure thereabove as provided by the present invention it is assured that manufacture is simple and assembly of a semiconductor unit can be effected properly with optimum operating behavior and for varied applications.

Figure 4:
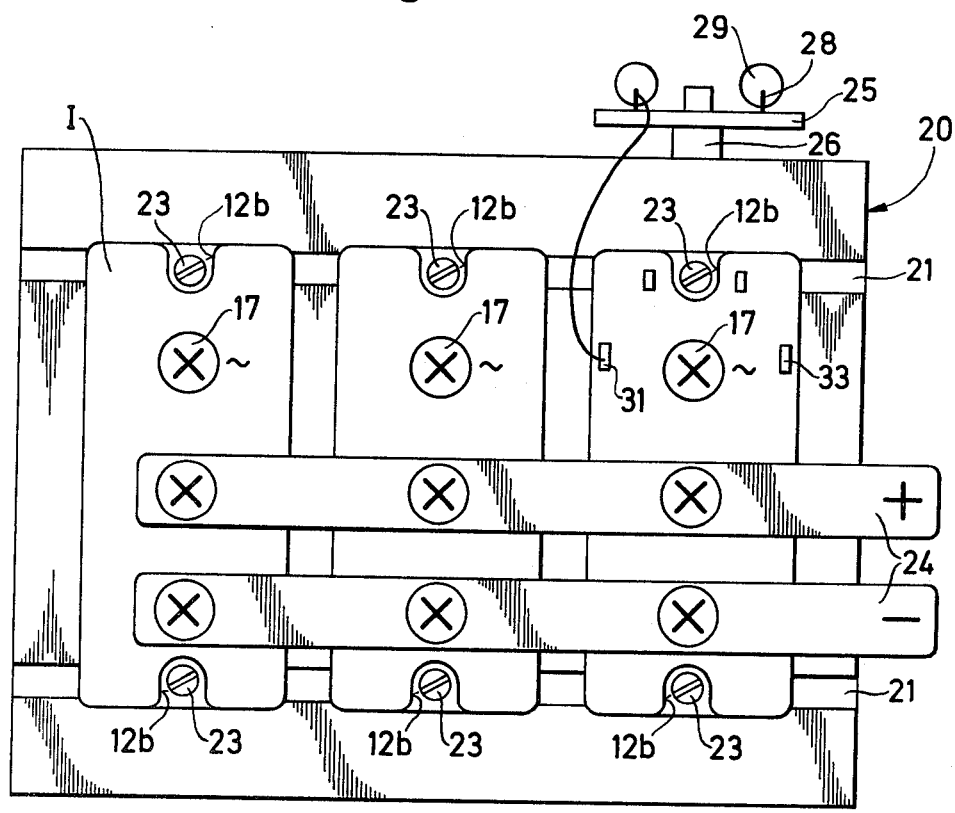
FIG. 4 is a plan view showing a semiconductor arrangement including a plurality of units according to the invention mounted on a common cooling member and connected in a three-phase bridge.

FIG. 4 shows an example of the use of semiconductor units according to the invention. On a cooling member 20, preferably of extrusion molded material and with the desired profile, slit-shaped recesses 21 are made in the supporting surface for the units and by means of said recesses three units are held according to the invention. For this purpose, each of the narrow sides of housing portion 12 of the unit may be provided with a recess 12b perpendicular to the base plate 1 and, in continuation of the same, a bore for the passage of a bolt or screw 23 is then provided in the base plate 1. The units may also be designed, however, so that the frontal faces of base plate 1 protrude beyond the housing portion 12, i.e., beyond the sidewalls 1a, and at least one through bore for fastening is provided in the free surface section. Furthermore, the base plate 1 may protrude beyond the housing member 12 on all sides and thus permit all around fastening by means of a clamping flange.

Due to the particular arrangement of the current conductor terminals 17 for the semiconductor devices of each unit it is possible to connect, in a surprisingly simple manner, three units having a total of six semiconductor devices to form a three-phase current bridge circuit merely by means of the two bus bars 24 as shown. Since each unit can also be provided with connecting means 31 or 33 for control and switching lines, it is easily possible, with a suitable profile of the cooling member, to additionally attach, for example, at least one circuit board 25 of insulating material which is disposed and mounted on another surface of the cooling member by means of a bolt 26 in a further fastening groove, circuit components 29 with control and switching functions for the semiconductor units as well as to connect them with special control sets in a simple manner, for example, via known soldering and/or plug-in members 28.

The use of the semiconductor unit according to the invention is not limited to the illustrated circuit. The semiconductor units can also contain semiconductor devices having two or more electrodes and any desired structure. Any number of units can be interconnected on a common cooling member or may be arranged separately for individual connection. The exchange of a unit is possible in a particularly simple manner without special measures on and with other units. Furthermore, any desired connections may be made where one or a plurality of units per branch are connected in series or in parallel and also with the inclusion of switching members.

It will be understood that the above description of the present invention is susceptible to various modifications changes and adaptations, and the same are intended to be comprehended within the meaning and range of equivalents of the appended claims.

What is claimed is:

1. In a semiconductor rectifier unit comprising: a metal base plate; a pair of spaced electrical contact plates each fastened to a surface of said base plate via a wafer of electrically insulating, thermally conductive material; a pair of semiconductor rectifier devices, each having at least one pn junction and a connecting contact on each of its two opposite major surfaces, each of said semiconductor devices being mounted on and having one of its said connecting contacts electrically connected to a respective one of said electrical contact plates; conductive means for electrically connecting one connecting contact of one of said semiconductor rectifier devices to one connecting contact of the other of said semiconductor rectifier devices to connect said semiconductor devices in a series circuit; first, second and third current conducting terminals connected to the input of said series circuit, to the output of said series circuit, and to said conductive means, respectively, said first, second and third current conducting terminals being arranged in a row with each of the two outer current conducting terminals of said row being electrically conductively connected to a respective one of said electrical contact plates; and a housing for said series circuit, including its connecting parts, formed by a hollow plastic member and said base plate; the improvement wherein: said base plate is trough-shaped, has a planar outer bottom surface, has a laterally extending flange on the side walls thereof, and is formed of a material which permits a permanently firm connection with components made of copper used to produce said series circuit as well as with components made of aluminum used to cool the unit;

means are provided on the bottom inner surface of said base plate, on which said series circuit is mounted, for maintaining said wafer of insulating material in a desired position on said base plate during production of said unit; and the edge portion of said plastic housing member which is adjacent said base plate is provided with a shaped region which matingly engages said flange to firmly connect said plastic housing member to said base plate.

2. A semiconductor unit as defined in claim 1 wherein said means for maintaining said wafer comprises a plurality of raised portions formed on said bottom inner surface of said base plate on a peripheral surface line determined by the contact of said wafer of insulating material on said inner bottom surface so that said raised portions are adjacent the peripheral edges of said wafer and provide a mount for same during the establishment of the solder connection between said wafer and said base plate.

3. A semiconductor unit as defined in claim 2, wherein said raised portions have a strip shape and a height which is equal to or less than the thickness of said wafer of insulating material.

4. A semiconductor unit as defined in claim 2 wherein said raised portions are hump-shaped and have a height which is equal to or less than the thickness of said wafer of insulating material.

5. A semiconductor unit as defined in claim 1, wherein said means for maintaining said wafer comprises a recess formed in said inner bottom surface of said base plate with the expanse and thickness of said recess being adapted to that of said wafer of insulating material.

6. A semiconductor unit as defined in claim 5 wherein each of said contact layers is fastened to said inner bottom surface of said base plate via a respective wafer of insulating material and wherein a respective said recess is provided in said inner bottom surface for each said wafer of insulating material.

7. A semiconductor unit as defined in claim 5 wherein: said base plate is made of copper on the side facing said wafer of insulating material and of aluminum on the opposite side, with the thickness of the copper layer being greater than the depth of said recess for accommodating said wafer of insulating material and with the aluminum layer having a minimum thickness which is determined only by the mechanical stability of said base plate.

8. A semiconductor unit as defined in claim 1 wherein said means for maintaining said wafer also maintains said contact plates in a desired position on the surface of said layer of insulating material during production of said unit.

9. A semiconductor unit as defined in claim 8 wherein said means for maintaining said wafer and said contact plates comprises a plurality of recesses formed in said inner bottom surface of said base plate on a peripheral surface line determined by the contact of said wafer on said inner bottom surface and a plurality of bolt-shaped limiter members engaged in said recesses for attaching said wafer and said contact plates to said base plate in a defined position, each of said limiter members being made of an elastic synthetic material and having in the longitudinal portions which protrude above said inner bottom surface of said base plate, a first portion with a small cross section which extends to at least the thickness of said wafer for maintaining said wafer in a fixed position and then a second portion with a larger cross section which extends over the surface of said wafer for maintaining said contacting members, which have a smaller areal expanse than said wafer, in a fixed position on said wafer of insulating material.

10. A semiconductor unit as defined in claim 9 wherein said wafer of insulating material is provided with metallizations on its opposed major surfaces; said base plate, said wafer of insulating material and said contact plates are soft soldered together; and said limiter members are made of a material which is stable at the temperature employed for the soft soldering of said base plate, said wafer of insulating material and said contact plates.

11. A semiconductor unit as defined in claim 1 wherein said base plate is made of an aluminum-magnesium alloy and is provided on said inner bottom surface with a coating of nickel to produce a solder connection with an adjacent metallization on said wafer of insulating material.

12. A semiconductor unit as defined in claim 1 wherein said base plate is made of copper on the side facing said wafer of insulating material and of aluminum on the opposite side.

13. A semiconductor rectifier arrangement including a plurality of semiconductor units as defined in claim 1 arranged in a row adjacent to one another with all of said semiconductor units having their base plates fastened on a surface of a common cooling member, and at least one bus bar electrically connecting said units together to produce a desired semiconductor rectifier circuit.

14. A semiconductor arrangement as defined in claim 3 further comprising at least one circuit plate of insulating material fastened on a further surface of said cooling member by means of fastening grooves and circuit components having control and switching functions for said semiconductor unit mounted on said circuit plate together with known solder and/or plug-in connecting members to produce switching connections between said circuit components and said semiconductor units.

* * * * *

UNITED STATES PATENT AND TRADEMARK OFFICE
CERTIFICATE OF CORRECTION

PATENT NO. : 4,106,052
DATED : August 8th, 1978
INVENTOR(S) : Winfried Schierz

It is certified that error appears in the above-identified patent and that said Letters Patent are hereby corrected as shown below:

In the heading of the patent, under [30] Foreign Application Priority Data, add --Sept. 1, 1977 Fed. Rep. of Germany 2639979--.

Column 8, line 60, change "3" to --13--.

Signed and Sealed this

Second Day of October 1979

[SEAL]

Attest:

RUTH C. MASON
Attesting Officer

LUTRELLE F. PARKER
Acting Commissioner of Patents and Trademarks